United States Patent [19]

Ishigaki et al.

[11] Patent Number: 5,600,589
[45] Date of Patent: Feb. 4, 1997

[54] STATIC RANDOM ACCESS MEMORY

[75] Inventors: Yoshiyuki Ishigaki; Motomu Ukita, both of Hyogo, Japan

[73] Assignee: Mitsubishi Denki Kabushiki Kaisha, Tokyo, Japan

[21] Appl. No.: 498,056

[22] Filed: Jul. 5, 1995

[30] Foreign Application Priority Data

Dec. 12, 1994  [JP]  Japan .................................. 6-307701

[51] Int. Cl.$^6$ ................................................. G11C 11/34
[52] U.S. Cl. ............................................ 365/154; 365/156
[58] Field of Search .................................... 365/154, 156, 365/189.11, 214, 202; 326/80, 85

[56]  References Cited

U.S. PATENT DOCUMENTS

| | | | |
|---|---|---|---|
| 4,099,265 | 7/1978 | Abe ........................................ | 365/154 |
| 4,110,840 | 8/1978 | Abe et al. ............................... | 365/154 |
| 4,578,778 | 3/1986 | Aoyama ................................. | 365/154 |
| 4,764,897 | 8/1988 | Vameyama et al. .................... | 365/154 |
| 4,879,690 | 11/1989 | Anami et al. .......................... | 365/201 |
| 5,070,482 | 12/1991 | Miyaji .................................... | 365/154 |
| 5,289,409 | 2/1994 | Reinschmidt .......................... | 365/154 |
| 5,410,506 | 4/1995 | Ferrant et al. .......................... | 365/154 |

OTHER PUBLICATIONS

1992 IEEE International Solid–State Circuits Conference, pp. 206–207 and 146–148, Feb. 21, 1992, K. Ishibashi, et al., "A 1V TFT–Load SRAM Using A Two–Step Word–Voltage Method".

Primary Examiner—Tan T. Nguyen
Attorney, Agent, or Firm—Oblon, Spivak, McClelland, Maier & Neustadt, P.C.

[57]  ABSTRACT

A stable action of a memory cell in low voltage operation is realized, while assuring the reliability of the memory cell fined in structure for enhancing the degree of integration. An external supply voltage ($V_{cc}$) is stepped down by a step-down transistor (Q1), and the stepped-down voltage is obtained as a potential for a bit line BIT. The external supply voltage ($V_{cc}$) is also stepped down by a step-down transistor (Q5), and the stepped-down voltage is obtained as a potential for a bit line $\overline{BIT}$. Furthermore, the external supply voltage ($V_{cc}$) is stepped down by a step-down transistor (Q3), and the stepped-down voltage is obtained as an internal supply voltage for a memory cell (MC). On the contrary, to gate electrodes of both access transistors A1, A2, the external supply voltage $V_{cc}$ is directly applied through word drivers 1, 2, respectively.

10 Claims, 11 Drawing Sheets

FIG. 10 (BACKGRONUND ART)

STATIC RANDOM ACCESS MEMORY

BACKGROUND OF THE INVENTION

1. Field of the Invention

The present invention relates to an effective technology applied in semiconductor device comprising an SRAM (Static Random Access Memory).

2. Description of the Background Art

Figure 5:
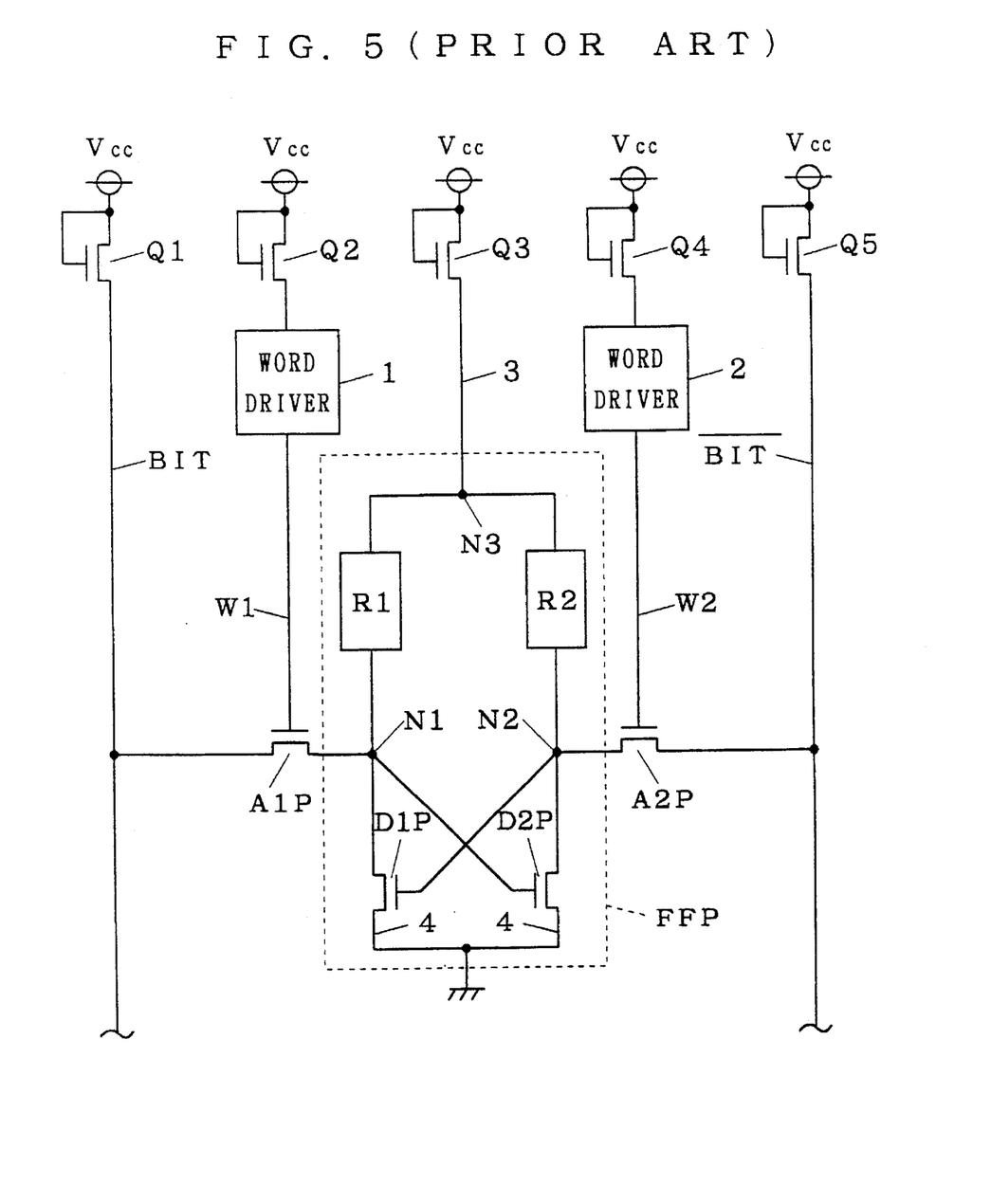
FIG. 5 is a circuit diagram showing a constitution of a conventional SRAM.

An example of a conventional SRAM is shown in FIG. 5.

The SRAM is a volatile semiconductor device disposing a memory cell at the intersection of a complementary data line (bit line) BIT, $\overline{BIT}$, and word lines W1, W2 arranged in a matrix form. The memory cell is composed of a flip-flop circuit FFP, and two access transistors A1P, A2P. By this flip-flop circuit FFP, two cross-coupled memory nodes N1, N2 are composed, and the SRAM possesses a bistable state, that is, (level of node N1, level of node 2) are (High, Low) or (Low, High), and as far as a specified external supply voltage $V_{cc}$ is applied, the bistable state is maintained, in principle. The access transistor A1P (A2) has its one semiconductor region (second electrode) connected to the memory node (input, output terminal of the flip-flop circuit FFP) N1 (N2), and has its other semiconductor region (first electrode) connected to the complementary data line BIT ($\overline{BIT}$). The gate electrode (third electrode) of the access transistor A1P (A2P) is connected to the word line W1 (W2), and conduction and non-conduction of the access transistor A1P (A2) are controlled by this word line W1 (W2).

When writing in data, selecting the word lines W1,W2, both access transistors A1P and A2P are made to conduct, and a voltage is applied by force to the bit line pair in response to desired logic value, and thereby a monostable state of the flip-flop circuit FFP is realized.

When reading out data, on the other hand, by conducting the access transistors (AP1, AP2), the potentials of the memory nodes (N1, N2) are transmitted to the bit lines (BIT, $\overline{BIT}$).

The flip-flop circuit FFP is composed of two driver transistors D1P, D2P, and two load elements R1, R2. As shown in FIG. 5, the driver transistor D1P and load element R1, and the driver transistor D2P and load element R2 respectively form inverters. Concerning the driver transistor D1P (D2P), its drain region (third electrode) is connected to the semiconductor region (second electrode) of the corresponding access transistor A1P (A2P), and its source region (fourth electrode) is connected to the ground line ($V_{EE}$ line). The gate electrodes of the driver transistors D1P, D2P are connected to the semiconductor region (second electrode) of the other access transistors A2P, A1P. Concerning the load element R1 (R2), one is connected to the semiconductor region (second electrode) of the corresponding access transistor A1P (A2P), and the other is connected to a power supply line 3 of the memory cell.

In the conventional semiconductor device, herein, in order to further advance the degree of integration and enhance the performance, it is necessary to reduce the transistor size, in particular, the gate length of MOS transistor. In the SRAM, too, by reducing the gate length, the occupied area in the memory cell is decreased, and higher degree of integration is realized. However, as the gate length is shortened, the channel length is also cut short, and hence unless the supply voltage is lowered proportionally, it gives rise to the problem of deterioration of MOS transistor characteristic due to hot carrier effect.

Accordingly, along with the trend of higher degree of integration, usually, the external supply voltage $V_{cc}$ is stepped down by using a down converter circuit, and a voltage lower than the external supply voltage $V_{cc}$ is applied to the power source line, word line and bit line of the memory cell, and such constitution is also employed in the SRAM shown in FIG. 5. That is, as shown in FIG. 5, the voltages stepped down from the external supply voltage $V_{cc}$ by the portion of threshold voltages $V_{Q1th}$ to $V_{Q5th}$ of N-channel MOS transistors Q1 to Q5 as step-down transistors are supplied to bit line BIT, word line W1, and power source line 3, word line W2 and bit line $\overline{BIT}$ of the memory cell, respectively.

The prior art described above can prevent occurrence of hot carrier effect by the decline of external supply voltage due to higher degree of integration. It brings about newly, however, the following problems.

That is, the lower the supply voltage applied to the memory cell, the more difficult is the stable action of the memory cell. This point is described below by referring to the input and output transmission characteristic of a pair of cross coupled inverters for forming a flip-flop circuit of the memory cell.

Figure 6:
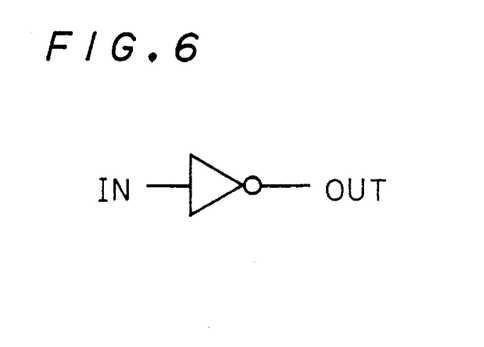
FIG. 6 is a structural diagram of an inverter.
Figure 7:
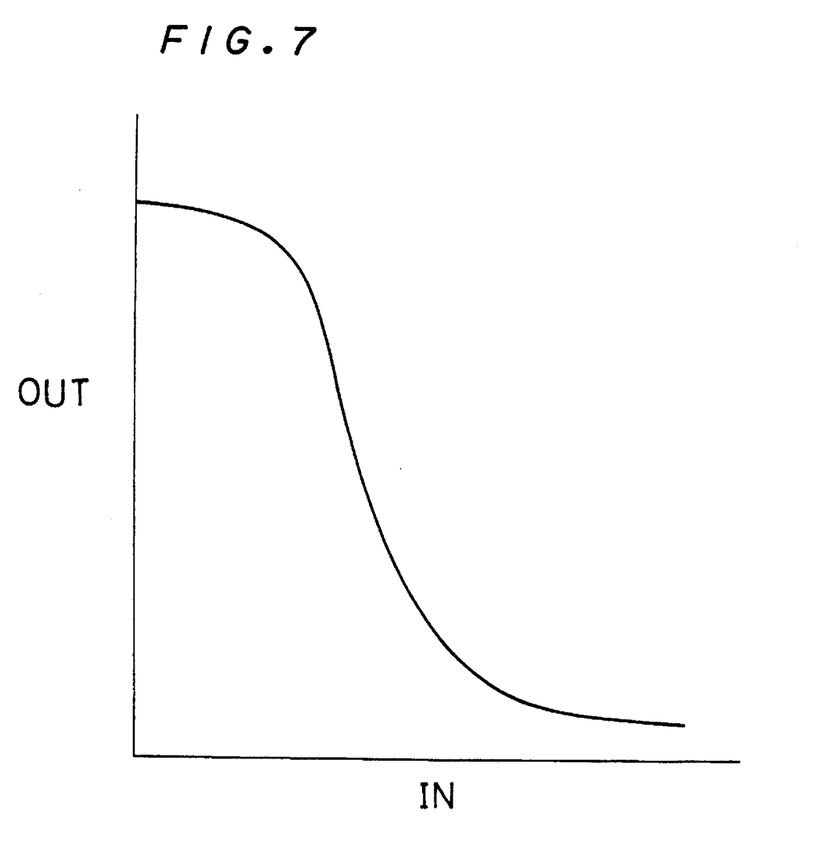
FIG. 7 is a diagram showing input and output characteristic in inverter unit.
Figure 8:
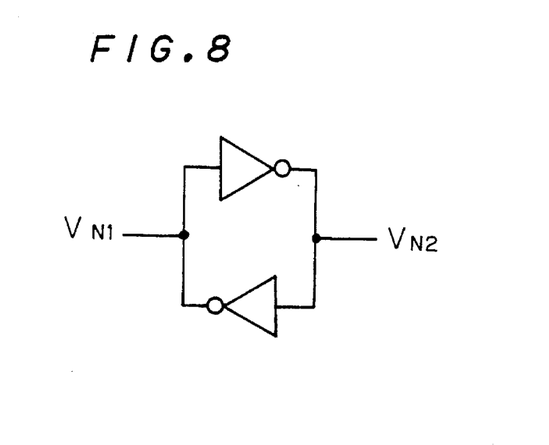
FIG. 8 is a diagram showing an inverter pair.
Figure 9:
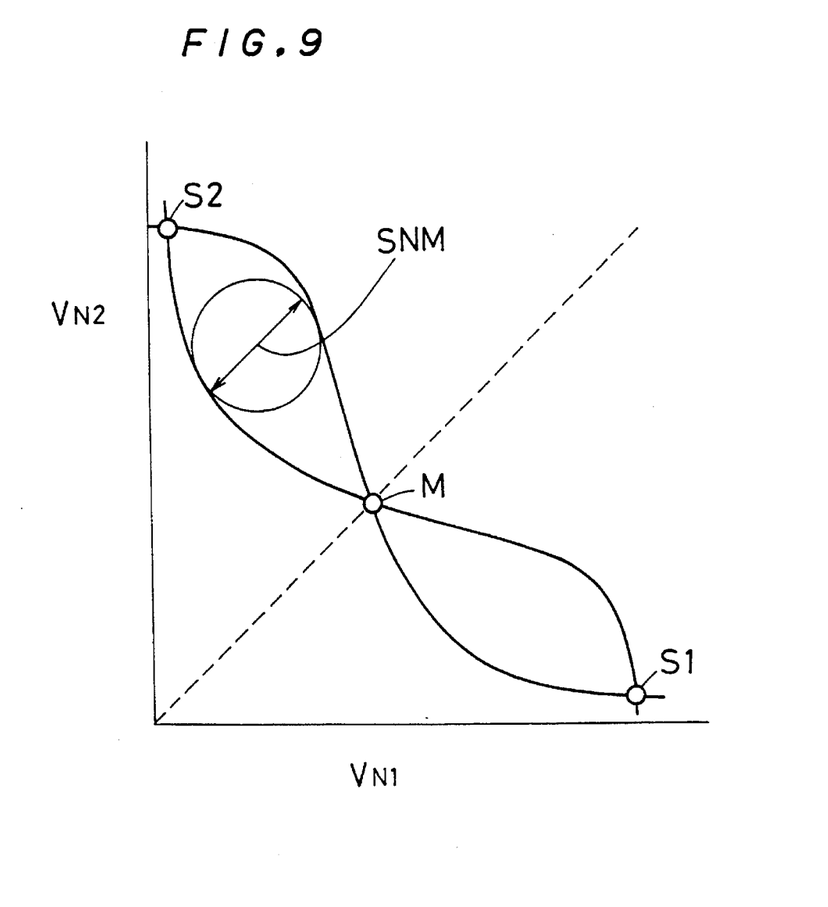
FIG. 9 is a diagram showing input and output characteristic of inverter pair.

The input and output transmission characteristic shown in FIG. 6 becomes as shown in FIG. 7. Therefore, the input and output characteristic of the pair of inverters shown in FIG. 8 is expressed in FIG. 9. To function as flip-flop, it is required to have two stable points expressed by S1 and S2 in FIG. 9. In order that the memory cell may withstand practical use, it is necessary to design so that the region enclosed by two curves in the diagram may be sufficiently wide. Accordingly, the diameter of the circle shown in the diagram is used as the index, and it is called SNM (Static Noise Margin).

Figure 10:
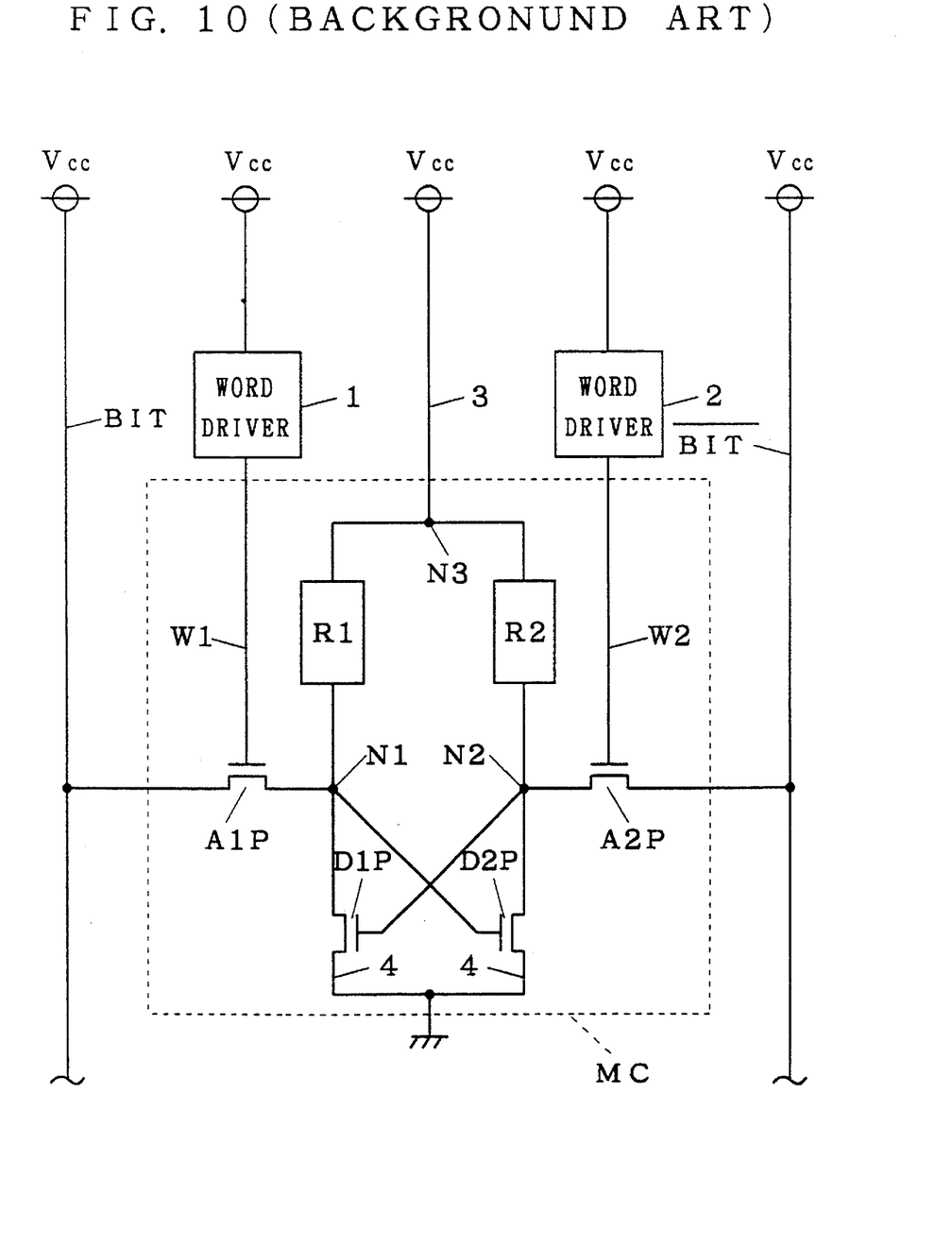
FIG. 10 is a diagram showing an equivalent circuit of SRAM.

Nextly, the transmission characteristic of the memory cell MC of which the equivalent circuit is shown in FIG. 10 is described below.

Figure 11:
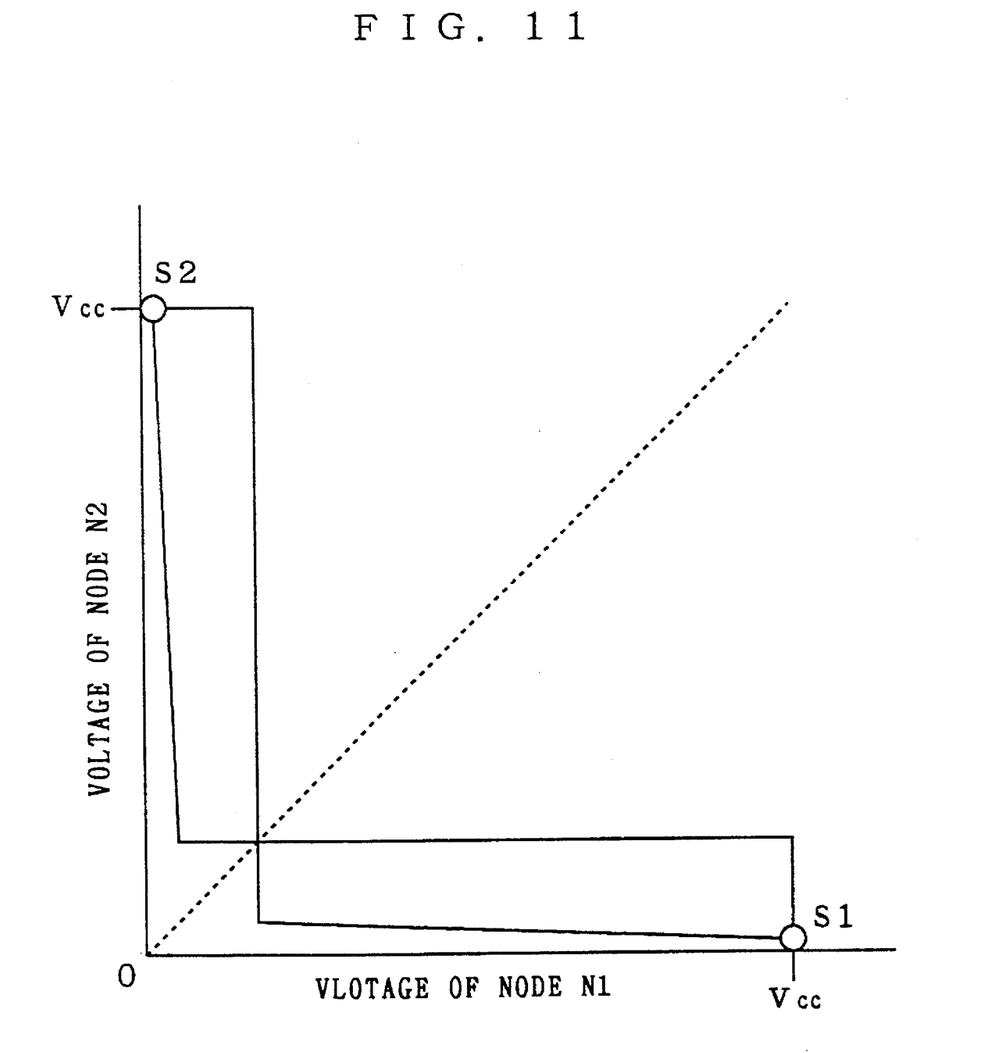
FIG. 11 is a characteristic diagram showing standby action of SRAM.

Usually, in standby state, access transistors (A1P, A2P) are non-conductive, and therefore the inverter of the memory cell MC is composed of a driver transistor and load elements. At this time, as shown in FIG. 11, the load elements (R1, R2) are high in impedance, and the inclination of the transitional part of the inverter output is steep, the SNM is large, so that the data is held stably.

Figure 12:
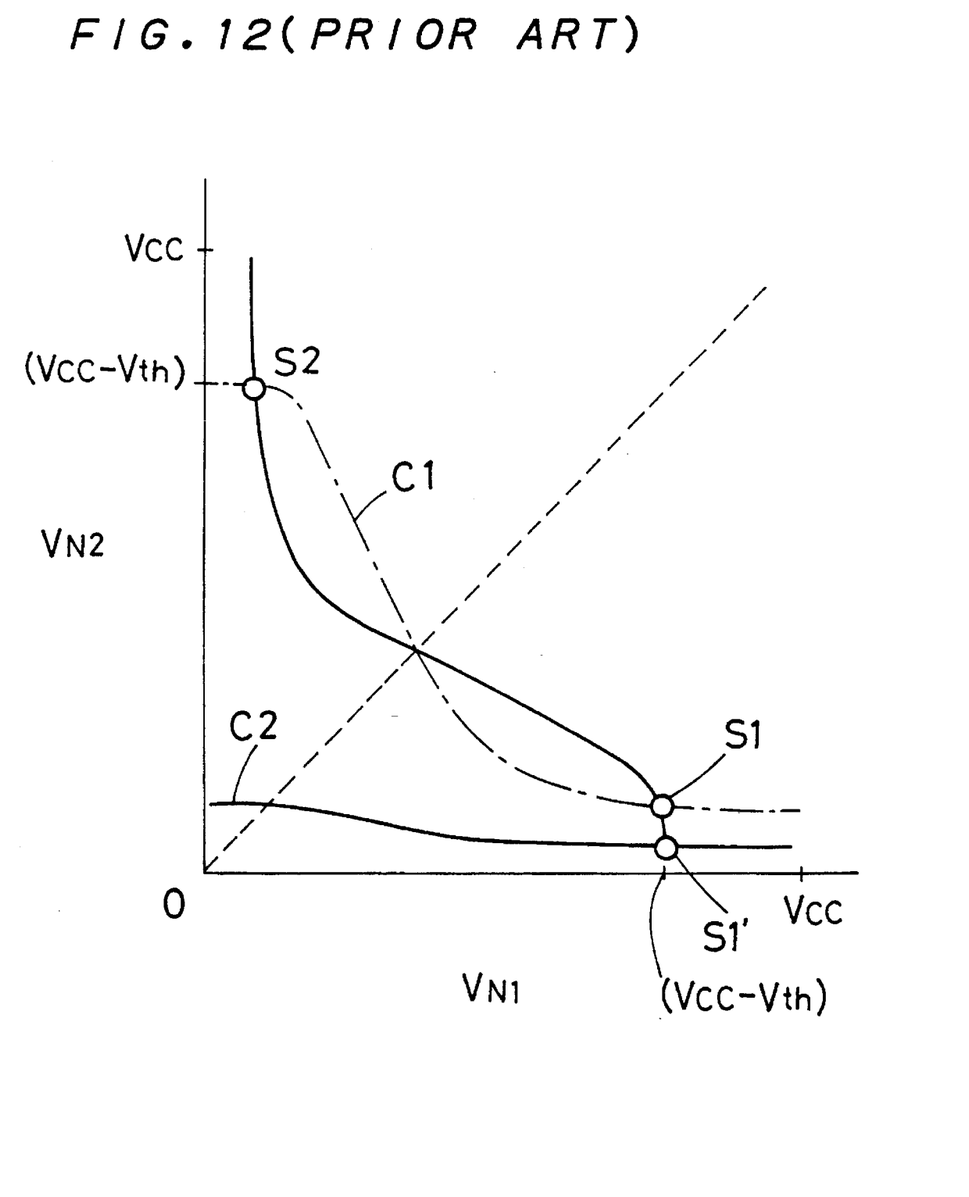
FIG. 12 is a characteristic diagram showing reading action of a conventional SRAM.

By contrast, when reading out data, in the memory cell, the access transistors are conductive, and a column current flows from the bit line into the low side memory node. That is, it is equivalent to a constitution in which a load of low impedance is connected parallel to the load elements, and the inverter of the memory cell must be handled as an enhancement mode NMOS comprising access transistors as load. When reading out, accordingly, as shown in FIG. 12, the gain of the inverter is considerably lowered as compared with the time of stand-by. In other words, the inclination of the transitional part of the inverter output becomes moderate. Consequently, the potential of the other high side memory node is lowered from the supply voltage level at the time of standby to (supply voltage-threshold voltage $V_{th}$ of access transistor), and the SNM is extremely lowered temporarily. This time is the most risky moment for the memory cell, and the bistable state is lost and the data may be broken unless a sufficient SNM is maintained. Usually, to expand the SNM, the conductance ratio of the driver transistor to the access transistor, also known as the beta ratio, is increased, and the gain of the inverter is made large. As a result, the inclination of the transitional part of the inverter output becomes steep. As the degree of integration is advanced, however, because of the necessity of reduction of layout area, it is difficult to increase the size of the driver transistor, in particular its gate width. Hence, to advance the degree of integration, the method of improving by increase of the beta ratio cannot be employed.

Figure 13:
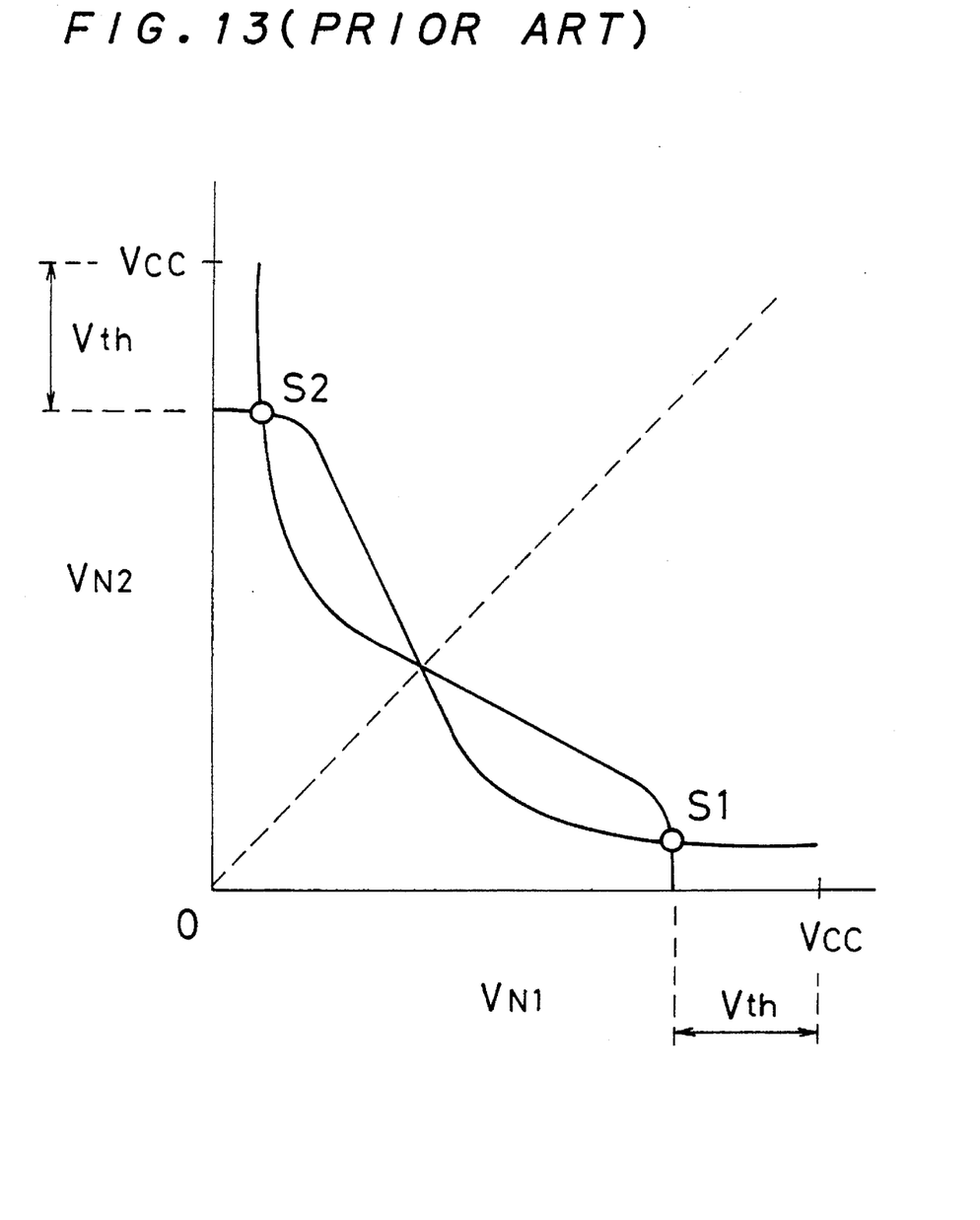
FIG. 13 is a characteristic diagram showing writing action of a conventional SRAM.

In writing action, incidentally, the access transistor conducts, and pulls down one bit line to L level by force, so that the corresponding other memory node is see to Low by force. This point is described below by referring to FIG. 13 showing the inverter transmission characteristic at the time of writing.

First, suppose the memory cell MC is stable at intersection S2, that is, (node N1, node N2)=(L level, H level). To obtain reverse data, (node N1, node N2)=(H level, L level), the bit line $\overline{BIT}$ of node N2 side is pulled down to L level by force. As a result, the inverter characteristic curve of N1 input and N2 output changes from a curve C1 to a curve C2. Hence, the stable point is only an intersection S1' of two curves to be in monostable state, so that data is rewritten.

Right after writing, however, the potential of the high side memory node is raised only up to (supply voltage–threshold voltage $V_{th}$ of the access transistor), and the problem is that the data is likely to be destroyed by external noise, $\alpha$-ray, or the like.

The problems become more serious when the influence of voltage drop by the portion of threshold voltage $V_{th}$ of the access transistor becomes larger due to lowering of supply voltage, and hence the stability of memory cell is extremely lowered unless the threshold voltage $V_{th}$ is reduced proportionally. Yet, if the threshold voltage $V_{th}$ is decreased, the sub-threshold current increases, which gives rise to a new problem of increase of standby current at the time of standby (in standby, the bit line is in High level, and the current flows from the Low side memory node through the driver transistor). It is hence difficult to reduce the threshold voltage $V_{th}$ proportionally.

SUMMARY OF THE INVENTION

A first aspect of the invention relates to a static random access memory which comprises a memory cell, said memory cell including a flip-flop circuit for holding data and an access transistor, said access transistor having one electrode and other electrode connected respectively to a bit line and the flip-flop circuit, with a gate electrode connected to a word line, wherein a voltage stepped down from an external supply voltage is supplied to the bit line and power source line of the memory cell, and the external supply voltage is directly supplied to the word line.

A second aspect of the invention relates to a static random access memory which comprises an external power source for supplying a supply voltage, a step-down circuit connected to an output of the external power source for stepping down the supply voltage, a bit line connected to an output of the step-down circuit, a power source line for memory cell connected to an output of the step-down circuit, a word line connected to an output of the external power source, a flip-flop circuit connected to the power source line for memory cell, and an access transistor comprising a first electrode, a second electrode and a third electrode connected respectively to the bit line, a node in the flip-flop circuit, and the word line, so that its action is controlled by the word line.

A third aspect of the invention relates to a static random access memory of the second aspect, in which the step-down circuit comprises a first step-down circuit and a second step-down circuit, and the bit line and the power source line for memory cell are respectively connected to the first step-down circuit and second step-down circuit.

A fourth aspect of the invention relates to a static random access memory of the third aspect, in which the first step-down circuit and the second step-down circuit respectively comprise a first step-down transistor and a second step-down transistor.

A fifth aspect of the invention relates to a static random access memory of the fourth aspect, in which the relation of (threshold voltage of the second step-down transistor)>(threshold voltage of the access transistor) is established.

A sixth aspect of the invention relates to a static random access memory of the fourth aspect, in which the relation of (threshold voltage of the second step-down transistor)>(threshold voltage of the first step-down transistor) is established.

A seventh aspect of the invention relates to a static random access memory of the sixth aspect, in which the threshold voltage of the first step-down transistor and the threshold voltage of the access transistor are equal to each other.

An eighth aspect of the invention relates to a static random access memory of the fourth aspect, in which the flip-flop circuit comprises a load element of which both ends are respectively connected to the second step-down transistor and the second electrode of the access transistor, and a driver transistor of which third electrode and fourth electrode are connected respectively to the second electrode and earth, and the threshold voltage of the driver transistor and the threshold voltage of the second step-down transistor are equal to each other.

A ninth aspect of the invention relates to a static random access memory of the eighth aspect, in which the relation of (the threshold voltage of the second step-down transistor)>(threshold voltage of the access transistor), and the relation of (the threshold voltage of the access transistor)=(threshold voltage of the first step-down transistor) are further established.

A tenth aspect of the invention relates to a static random access memory which comprises an external power source for supplying an external supply voltage, a step-down circuit connected to an output of the external power source for stepping down the external supply voltage, a bit line connected to an output of the step-down circuit, a power source line for memory cell connected to an output of the step-down circuit, a word line connected to an output of the external power source, a flip-flop circuit connected to the power source line for memory cell, and an access transistor comprising a gate electrode provided with the external supply voltage directly from the word line, one semiconductor region provided with a potential obtained by stepping down the external supply voltage from the bit line, and other semiconductor region provided with a potential of a memory node in the flip-flop circuit, of which conduction and nonconduction are controlled by the word line.

According to the first aspect of the invention, since the external supply voltage is directly supplied to the gate electrode of the access transistor, the potential of the other electrodes of the access transistor is raised up to the potential of subtracting the threshold voltage of the access transistor from the external supply voltage or the potential of the bit line.

According to the second aspect of the invention, the potential on the bit line and the voltage applied to the flip-flop circuit are supply voltage stepped down by the step-down circuit, while the access transistor are controlled by the supply voltage directly applied to the third electrode thereof. Accordingly, the potential of the second electrode of the access transistor is raised up to the potential of subtracting the threshold voltage of the access transistor from the external supply voltage or the potential of the bit line.

According to the third aspect of the invention, the voltage applied to the bit line and flip-flop circuit is the voltage stepped down from the supply voltage by the first step-down circuit and second step-down circuit, respectively.

According to the fourth aspect of the invention, the voltage applied to the bit line and flip-flop circuit is the voltage stepped down from the supply voltage stepped down by the first step-down transistor and second step-down transistor, respectively.

According to the fifth aspect of the invention, the potential of the second electrode of the access transistor is not smaller than the balance of subtracting the threshold voltage of the second step-down transistor from the supply voltage.

According to the sixth aspect of the invention, the potential of the second electrode of the access transistor is not smaller than the balance of subtracting the threshold voltage of the second step-down transistor from the supply voltage.

According to the seventh aspect of the invention, the potential of the second electrode of the access transistor is raised up to the potential of the bit line.

According to the eighth aspect of the invention, the threshold voltage of the driver transistor is set high, and generation of unnecessary current at the time of standby is prevented, and the driver transistor and second step-down transistor can be manufactured at equal threshold voltage, so that the number of processes may be reduced.

Therefore, in the first aspect, by preventing data breakage due to external noise, α-ray or the like, the static noise margin when reading out data from the memory cell is dramatically enhanced. Moreover, deterioration of reliability due to hot carrier effect can be also prevented. As a result, when the degree of integration of the memory cell is advanced to be fine in structure, a stable action of the memory cell is realized while assuring the reliability of the memory cell.

In the second aspect, therefore, while preventing deterioration of reliability due to hot carrier effect, the static noise margin when reading out data from the memory cell is dramatically enhanced, and data breakage due to external noise, α-ray or the like can be also prevented. Accordingly, when the memory cell is fined in structure for higher degree of integration, the reliability of the memory cell does not deteriorate, and the action of the static random access memory in low voltage operation can be stabilized.

In the third aspect, the action of the static random access memory in low voltage operation can be stabilized without deteriorating the reliability.

In the fourth aspect, the action of the static random access memory in low voltage operation can be stabilized without deteriorating the reliability.

In the fifth aspect, data breakage due to external noise, α-ray or the like can be further prevented, so that the action of the static random access memory may be further stabilized.

In the sixth aspect, data breakage due to external noise, α-ray or the like can be further prevented, so that the action of the static random access memory may be further stabilized.

In the seventh aspect, without increasing the number of processes, the action of the static random access memory in low voltage operation can be stabilized, while preventing deterioration of reliability of the memory cell.

In the eighth aspect, increase of standby current can be prevented without increasing the number of processes, and moreover the action of the static random access memory in low voltage operation can be stabilized, while preventing deterioration of reliability of the memory cell.

It is therefore an object of the present invention to, in the light of the above problems, maintain a stable action of the memory cell while assuring the reliability of the memory cell fine-structured for higher degree of integration, in an SRAM.

It is other object of the invention to realize the constitution of an SRAM capable of curtailing the number of manufacturing processes of the SRAM while achieving the above object.

It is a different object of the invention to realize an SRAM resistant to data breakage due to external noise, α-ray or the like.

It is a further object to prevent increase of standby current.

It is a further different object to prevent deterioration of reliability due to hot carrier effect.

These and other objects, features, aspects and advantages of the present invention will become more apparent from the following description of the present invention when taken in conjunction with the accompanying drawings.

DESCRIPTION OF THE PREFERRED EMBODIMENT

A preferred embodiment of the invention is described below.

Figure 1:
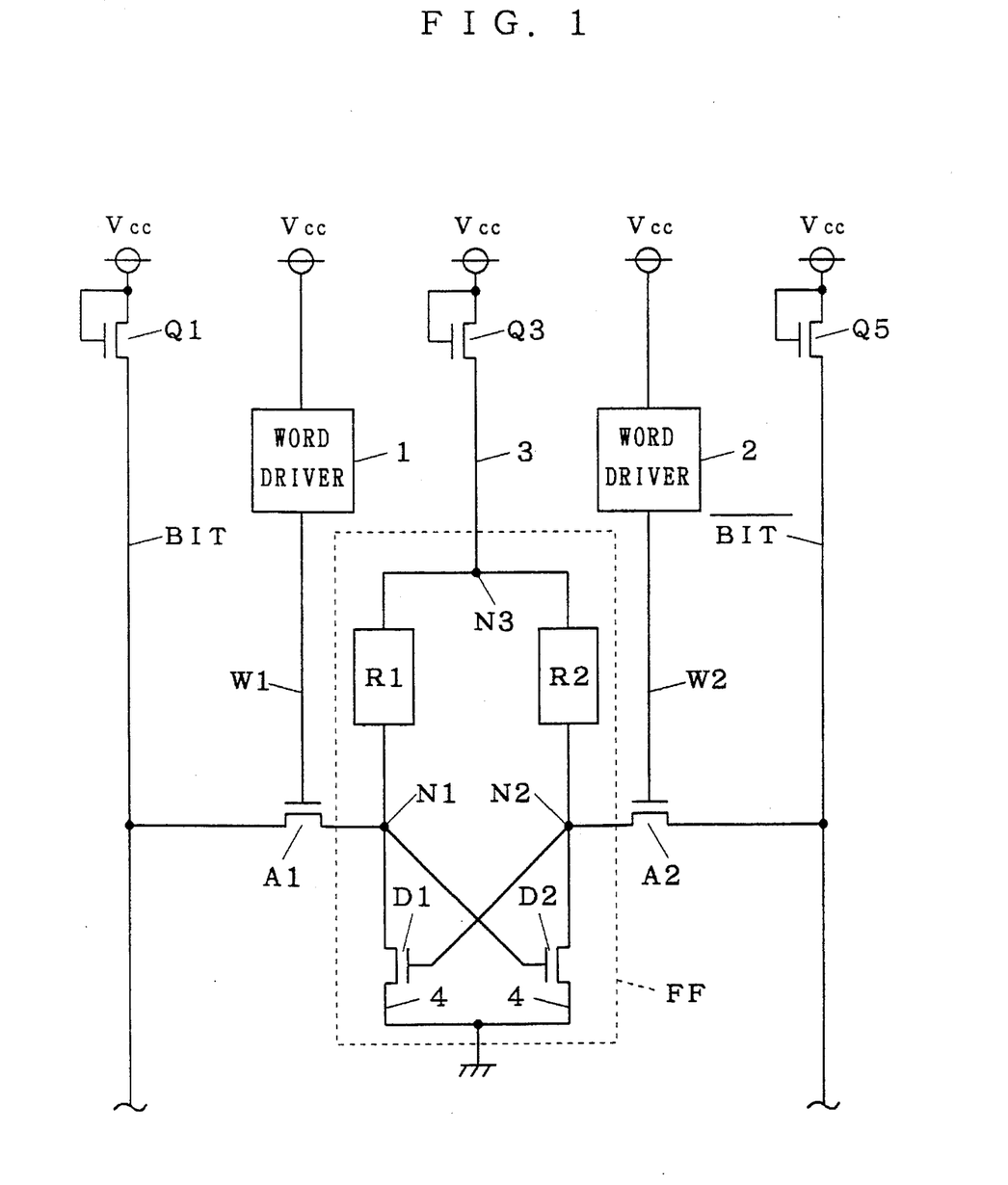
FIG. 1 is a circuit diagram showing a constitution of an SRAM in a preferred embodiment of the invention.

FIG. 1 is a circuit diagram of an SRAM in a preferred embodiment of the invention. In the diagram, a memory cell comprises a flip-flop FF for holding data, and first and second access transistors A1, A2. A gate electrode (third electrode) of the access transistor A1 (first access transistor) is connected to a word line W1 (first word line), its first electrode is connected to a bit line BIT (first bit line), and its second electrode is connected to a node N1 (first node or memory node) of the flip-flop FF. Likewise, a gate electrode (third electrode) of the access transistor A2 (second access transistor) is connected to a word line W2 (second word line), its first electrode is connected to a bit line $\overline{\text{BIT}}$ (second bit line), and its second electrode is connected to a node N2 (second node or memory node) of the flip-flop FF. A first step-down transistor Q1 (an example of first step-down circuit) supplies a potential ($V_{cc}-V_{Q1th}$) stepping down an external supply voltage $V_{cc}$ by its threshold voltage $V_{Q1th}$ to the bit line BIT. Likewise, a first step-down transistor Q5 supplies a potential ($V_{cc}-V_{Q5th}$) stepping down an external supply voltage $V_{cc}$ by its threshold voltage $V_{Q5th}$ to the bit line $\overline{\text{BIT}}$. Therefore, in one semiconductor region of the access transistor A1, a potential stepped down from the external supply voltage is supplied from the bit line BIT and first electrode, and in other semiconductor region, the potential of the node N1 is supplied. Likewise, in one semiconductor region of the access transistor A2, a potential stepped down from the external supply voltage is supplied from the bit line $\overline{\text{BIT}}$ and first electrode, and in other semiconductor region, the potential of the node N2 is supplied. A second step-down transistor Q3 (an example of second step-down circuit) steps down the external supply voltage $V_{cc}$ by its threshold voltage $V_{Q3th}$, and supplies the obtained potential ($V_{cc}-V_{Q3th}$) to a power source wire 3 for memory cell.

Word drivers 1, 2 supply external supply voltage $V_{cc}$ onto word lines W1, W2 when writing or reading data.

The flip-flop FF possesses two driver transistors D1, D2, and load elements R1, R2. That is, one end of the load element R1 (first load element) is connected to the power source line for memory cell 3 with node N3, and the other end is connected to node N1. A drain electrode (third electrode) and a source electrode (fourth electrode) of the driver transistor D1 (first driver transistor) are respectively connected to node N1 and ground line 4. Both ends of the load element R2 (second load element) are respectively connected to node N3 (third node) and node N2 (second node), and a drain (third electrode) and source (fourth electrode) of the driver transistor D2 are respectively connected to node N2 and ground line 4.

What the SRAM shown in FIG. 1 structurally differs from FIG. 5 is that step-down transistors (corresponding to transistors Q2, Q4 in FIG. 5) are not connected to the word drivers 1, 2. That is, the supply voltage supplied to the word drivers 1, 2, that is, word lines WL1, WL2 is same as the external supply voltage $V_{cc}$ and the external supply voltage $V_{cc}$ is not stepped down. As a result, when the word lines WL1, WL2 are at high level, the electrical potential is pulled up to the external supply voltage $V_{cc}$ and hence in the access transistor having the second electrode connected to the node (N1 or N2) at high potential level, there is no influence of step-down of the threshold voltage $V_{th}$.

Figure 2:
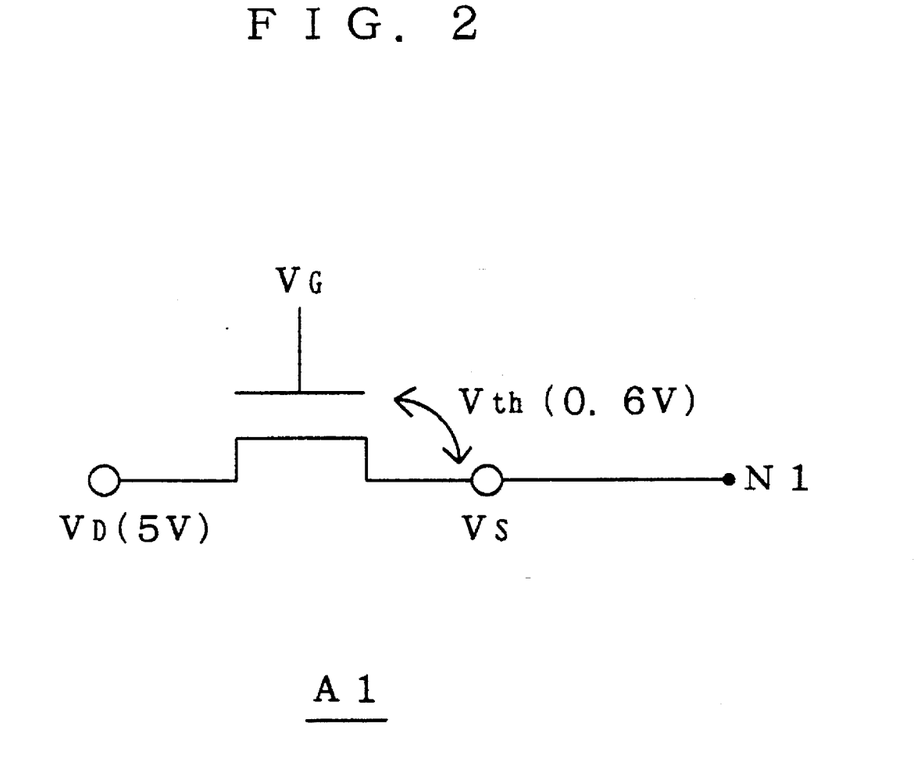
FIG. 2 is a diagram showing the point of notice of the invention.

This point is further described by reference to an equivalent circuit of access transistor A1 shown as an NMOS transistor in FIG. 2. Supposing the gate potential $V_G$ to be 5 V, drain voltage $V_D$ to be 5 V, and threshold voltage $V_{th}$ to be 0.6 V, the source potential $V_S$ is pulled up to $V_G-V_{th}=$ 4.4 V at this time. However, if the gate potential $V_G$ is pulled up to, for example, 7 V, the source potential $V_S$ is not pulled up to 6.4 V, but is pulled up to 5 V. In this case, therefore, the potential of the node N1 (N2) in the bistable state when reading out data is pulled up to 5 V. This point is noticed in the SRAM disclosed in FIG. 1.

Figure 3:
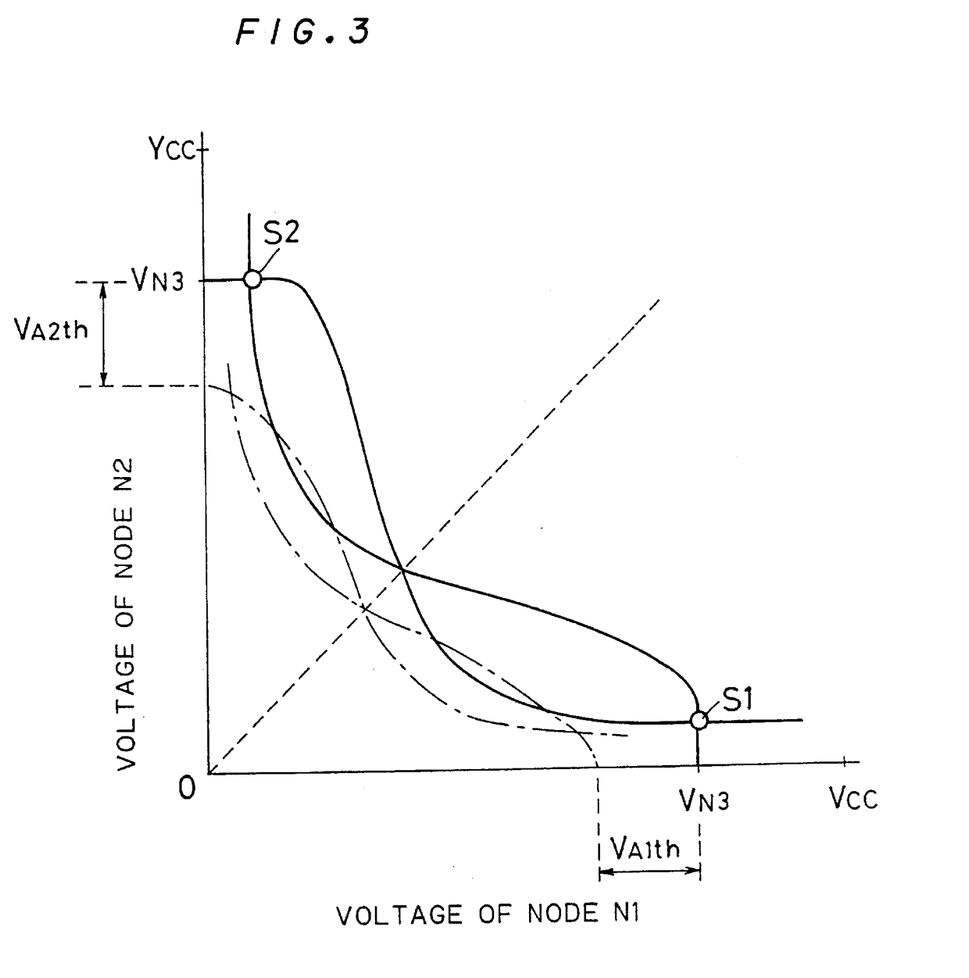
FIG. 3 is a transmission characteristic diagram showing the reading action of SRAM in a preferred embodiment of the invention.
Figure 4:
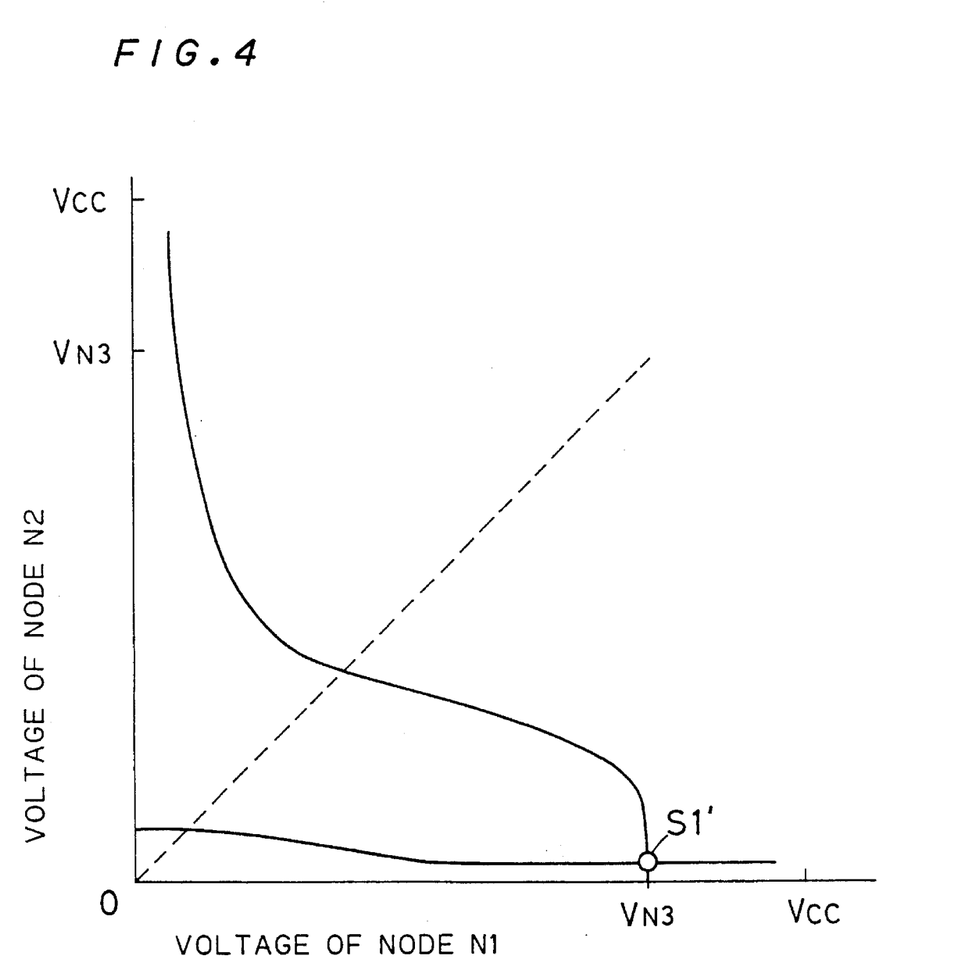
FIG. 4 is a transmission characteristic diagram showing the writing action of SRAM in a preferred embodiment of the invention.

A reading transmission curve of the SRAM shown in FIG. 1 is depicted in FIG. 3, and a writing transmission curve in FIG. 4. In particular, the transmission curve indicated by single dot chain line in FIG. 3 refers to a prior art (FIG. 5). In FIG. 3, the potential of nodes N1, N2 at the high level side at two stable points S1, S2 is raised up to the potential (internal supply voltage) $V_{N3}$ at node N3, as compared with the prior art. That is, at the node N1 side, occurrence of step-down of the potion of the threshold voltage $V_{A1th}$ of the access transistor A1 is prevented, and at the node N2 side, occurrence of step-down of the portion of the threshold voltage $V_{A2th}$ of the access transistor A2 is prevented. At the time of writing, the potential of the node N1 at high level at stable point S1' is raised up to the potential $V_{N3}$ of the node N3. Thus, in either FIG. 3 or FIG. 4, there is no influence of drop of the portion of the threshold voltage $V_{th}$ of the access transistor to the high level side node potential, and hence the SRAM in FIG. 1 is resistant to data breakage due to external noise, α-ray, or the like. In addition, the SNM in reading is substantially improved.

(Modified example 1)

In the illustrated embodiment, the high node potential is raised up to the stepped-down potential supplied to the power source line for memory cell 3 ($V_{N3}=V_{cc}-V_{Q3th}$; $V_{Q3th}$ is the threshold voltage of the second step-down transistor Q3). Herein, owing to the manufacturing process, if the threshold voltage $V_{Q3th}$ of the second step-down transistor Q3 connected in the memory cell is set lower than the threshold voltages $V_{A1th}$, $V_{A2th}$ of the access transistors A1, A2 ($V_{Q3th}<V_{A1th}$, $V_{A2th}$), the high node potential is not pulled up to the step-down potential $V_{N3}$ supplied to the memory cell.

Accordingly, by defining the both threshold voltages $V_{A1th}$, $V_{A2th}$ of the access transistors A1, A2 within the threshold voltage $V_{Q3th}$ of the second step-down transistor Q3, that is, $V_{A1th}\leq V_{Q3th}$, $V_{A2th}\leq V_{Q3th}$, such problem is solved. At this time, the high node potential is pulled up to the step-down potential $V_{N3}$ to be supplied to the memory cell completely and promptly, so that the SRAM has a stronger resistance to data breakage due to external noise, alpha-ray, or the like.

(Modified example 2)

Incidentally, if the threshold voltages $V_{Q1th}$, $V_{Q5th}$ of the first step-down transistors Q1, Q5 connected to the bit lines BIT, $\overline{\text{BIT}}$ are higher than the threshold voltage $V_{Q3th}$ of the second step-down transistor Q3 connected to the memory cell ($V_{Q1th}$, $V_{Q5th}>V_{Q3th}$), the high node potential is raised only up to the potential on the bit lines BIT, $\overline{\text{BIT}}$, and not pulled up to the step-down potential $V_{N3}$ supplied to the memory cell.

In manufacturing, hence, by setting in the relation of $V_{Q1th}\leq V_{Q3th}$, $V_{Q5th}\leq V_{Q3th}$, the high node potential is pulled up to the step-down voltage $V_{N3}$ supplied to the memory cell completely and promptly, and in this case, too, the SRAM becomes further resistant to data breakage due to external noise, α-ray, or the like.

(Modified example 3)

Furthermore, the threshold voltages $V_{D1th}$, $V_{D2th}$ of the driver transistors D1, D2 of the memory cell are usually preferred to be set at high values in order to prevent increase of standby current due to sub threshold leak.

By setting the threshold voltage of the both driver transistors D1, D2 equally to that of the second step-down transistor, that is, by setting $V_{D1th}=V_{D2th}=V_{Q3th}$, the above effects are obtained without increasing the number of manufacturing processes and while preventing increase of standby current.

(Modified example 4)

Similarly, by setting [each threshold voltage of first step-down transistors Q1, Q5 ($V_{Q1th}=V_{Q5th}$)=(threshold voltage of access transistors A1, A2 ($V_{A1th}=V_{A2th}$))] ≦[(threshold voltage $V_{Q3th}$ of second step-down transistor Q3)=(threshold voltage of driver transistors D1, D2 ($V_{D1th}=V_{D2th}$))], the above effects are obtained without increasing the number of processes.

In the SRAM of the invention, the external supply voltage $V_{cc}$ and internal supply voltage $V_{N3}$ are applied respectively to gate electrodes of the access transistors A1, A2 and driver transistors D1, D2 for composing the memory cell, but in the source and drain regions of the access transistors A1, A2, only the potential stepped down from the external supply voltage $V_{cc}$ is applied, and in the drains of the driver transistors D1, D2, only $V_{N3}$ is applied, and therefore deterioration of reliability due to hot carrier effect can be prevented same as in the case of prior art stepping down also the potential of the gate electrode.

In the foregoing embodiment and modified examples, the potential stepped down from the external supply voltage is supplied to the flip-flop circuit for holding data and bit line, while the external supply voltage is directly set as the word line potential without being stepped down, and hence if the gate length of the MOS transistors for composing the memory cell is reduced for the purpose of advancing the degree of integration and improving the performance, the reliability is not lowered, and a stable action is obtained also in low voltage operation.

While the invention has been shown and described in detail, the foregoing description is in all aspects illustrative and not restrictive. It is therefore understood that numerous modifications and variations can be devised without departing from the scope of the invention.

We claim:

1. A static random access memory comprising:
   an internal power source line;
   a word line;
   a bit line;
   a memory cell, said memory cell comprising, a flip-flop circuit for holding data, and an access transistor, said access transistor comprising,
   one electrode connected to the bit line,
   a second electrode connected to said flip-flop circuit, and
   a gate electrode connected to the word line,
   wherein a voltage stepped down from an external supply voltage is supplied to said bit line and the internal power source line of said memory cell, and said external supply voltage is directly supplied to said word line.

2. A static random access memory comprising:
   an external power source for supplying a supply voltage,
   a step-down circuit connected to an output of said external power source for stepping down said supply voltage,
   a bit line connected to an output of said step-down circuit,
   a power source line for the memory cell connected to an output of said step-down circuit,
   a word line connected to an output of said external power source,
   a flip-flop circuit connected to said power source line for the memory cell, and
   an access transistor comprising a first electrode, a second electrode and a third electrode connected respectively to said bit line, a node in said flip-flop circuit, and said word line, so that its action is controlled by said word line.

3. A static random access memory of claim 2,
   wherein said step-down circuit comprises a first step-down circuit and a second step-down circuit, and
   said bit line and said power source line for memory cell are respectively connected to said first step-down circuit and second step-down circuit.

4. A static random access memory of claim 3,
   wherein said first step-down circuit and said second step-down circuit comprise a first step-down transistor and a second step-down transistor, respectively.

5. A static random access memory of claim 4,
   wherein the relation of (threshold voltage of said second step-down transistor)≧(threshold voltage of said access transistor) is established.

6. A static random access memory of claim 4,
   wherein the relation of (threshold voltage of said second step-down transistor)≧(threshold voltage of said first step-down transistor) is established.

7. A static random access memory of claim 6,
   wherein the threshold voltage of said first step-down transistor and the threshold voltage of said access transistor are equal to each other.

8. A static random access memory of claim 4,
   wherein said flip-flop circuit comprises:
   a load element of which both ends are respectively connected to said second step-down transistor and said second electrode of said access transistor, and
   a driver transistor of which third electrode and fourth electrode are respectively connected to said second electrode and earth, and
   threshold voltage of said driver transistor and the threshold voltage of said second step-down transistor are equal to each other.

9. A static random access memory of claim 8,
   wherein the relation of (the threshold voltage of said second step-down transistor)≧(threshold voltage of said access transistor), and
   the relation of (the threshold voltage of said access transistor)=(threshold voltage of said first step-down transistor) are further established.

10. A static random access memory comprising:
    an external power source for supplying an external supply voltage,
    a step-down circuit connected to an output of said external power source for stepping down said external supply voltage,
    a bit line connected to an output of said step-down circuit,
    a power source line for the memory cell connected to an output of said step-down circuit,
    a word line connected to an output of said external power source,
    a flip-flop circuit connected to said power source line for the memory cell, and
    an access transistor comprising a gate electrode provided with said external supply voltage directly from said word line, one semiconductor region provided with a potential obtained by stepping down said external supply voltage from said bit line, and other semiconductor region provided with a potential of a memory node in said flip-flop circuit, of which conduction and non-conduction are controlled by said word line.

* * * * *